United States Patent
Nagase et al.

(10) Patent No.: US 8,665,639 B2
(45) Date of Patent: Mar. 4, 2014

(54) MAGNETORESISTIVE ELEMENT AND MAGNETIC MEMORY

(75) Inventors: Toshihiko Nagase, Yokohama (JP); Tadashi Kai, Tokyo (JP); Katsuya Nishiyama, Yokohama (JP); Eiji Kitagawa, Yokohama (JP); Tadaomi Daibou, Yokohama (JP); Masahiko Nakayama, Yokohama (JP); Makoto Nagamine, Komae (JP); Shigeto Fukatsu, Yokohama (JP); Masatoshi Yoshikawa, Yokohama (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/407,039

(22) Filed: Feb. 28, 2012

(65) Prior Publication Data

US 2012/0163070 A1 Jun. 28, 2012

Related U.S. Application Data

(63) Continuation of application No. PCT/JP2010/055938, filed on Mar. 31, 2010.

(51) Int. Cl.
*G11C 11/00* (2006.01)
(52) U.S. Cl.
USPC .......................................... 365/158; 365/173
(58) Field of Classification Search
USPC .................... 365/48, 148, 158, 173
See application file for complete search history.

(56) References Cited

U.S. PATENT DOCUMENTS

| | | | | |
|---|---|---|---|---|
| 7,432,574 B2* | 10/2008 | Nakamura et al. | ............ | 257/421 |
| 7,596,015 B2* | 9/2009 | Kitagawa et al. | ............ | 365/158 |
| 7,663,197 B2 | 2/2010 | Nagase et al. | | |
| 7,750,421 B2 | 7/2010 | Horng et al. | | |
| 7,889,543 B2* | 2/2011 | Morise et al. | ............ | 365/158 |

(Continued)

FOREIGN PATENT DOCUMENTS

| | | |
|---|---|---|
| JP | 2006-80287 | 3/2006 |
| JP | 2006-165265 | 6/2006 |

(Continued)

OTHER PUBLICATIONS

International Search Report issued Jul. 20, 2010 in PCT/JP2010/055938 filed Mar. 31, 2010.

(Continued)

*Primary Examiner* — Gene Auduong
(74) *Attorney, Agent, or Firm* — Oblon, Spivak, McClelland, Maier & Neustadt, L.L.P.

(57) ABSTRACT

According to one embodiment, a magnetoresistive element includes a first magnetic layer with a perpendicular and variable magnetization, a second magnetic layer with a perpendicular and invariable magnetization, and a first nonmagnetic layer between the first and second magnetic layer. The first magnetic layer has a laminated structure of first and second ferromagnetic materials. A magnetization direction of the first magnetic layer is changed by a current which pass through the first magnetic layer, the first nonmagnetic layer and the second magnetic layer. A perpendicular magnetic anisotropy of the second ferromagnetic material is smaller than that of the first ferromagnetic material. A film thickness of the first ferromagnetic material is thinner than that of the second ferromagnetic material.

20 Claims, 12 Drawing Sheets

(56) References Cited

U.S. PATENT DOCUMENTS

| | | | |
|---|---|---|---|
| 7,936,598 B2* | 5/2011 | Zheng et al. | 365/173 |
| 7,940,600 B2* | 5/2011 | Dimitrov et al. | 365/230.07 |
| 8,036,025 B2 | 10/2011 | Nagase et al. | |
| 8,098,514 B2 | 1/2012 | Nagase et al. | |
| 8,218,355 B2* | 7/2012 | Kitagawa et al. | 365/158 |
| 8,299,552 B2* | 10/2012 | Nagase et al. | 257/421 |
| 2007/0030724 A1 | 2/2007 | Hosomi et al. | |
| 2007/0096229 A1 | 5/2007 | Yoshikawa et al. | |
| 2012/0008381 A1 | 1/2012 | Nagase et al. | |

FOREIGN PATENT DOCUMENTS

| | | |
|---|---|---|
| JP | 2007-048790 | 2/2007 |
| JP | 2007-150265 | 6/2007 |
| JP | 2009-027177 | 2/2009 |
| JP | 2010-021580 | 1/2010 |

OTHER PUBLICATIONS

Mikihiko Oogane, et al.; "Magnetic Damping in Ferromagnetic Thin Films"; Japanese Journal of Applied Physics; 2006, vol. 45, No. 5A, pp. 3889-3891.

J.C. Slonczewski; "Current-driven excitation of magnetic multilayers"; Journal of Magnetism and Magnetic Materials, 1996, vol. 159, pp. L1-L7.

International Preliminary Report on Patentability issued Nov. 1, 2012, in PCT/JP2010/055938, filed Mar. 31, 2010.

Written Opinion of the International Searching Authority issued Jul. 20, 2010, in PCT/JP2010/055938 filed Mar. 31, 2010.

Final Office Action mailed Sep. 10, 2013, issued in corresponding Japanese patent application No. 2011-539815 with English translation.

\* cited by examiner

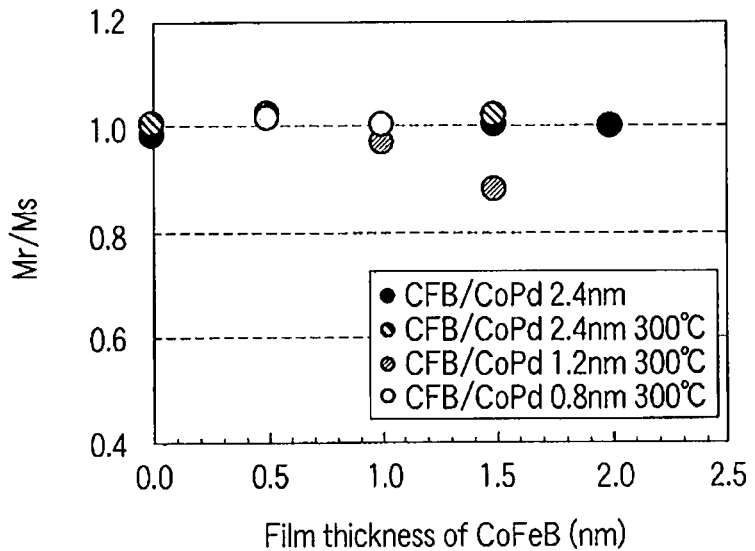
F I G. 5
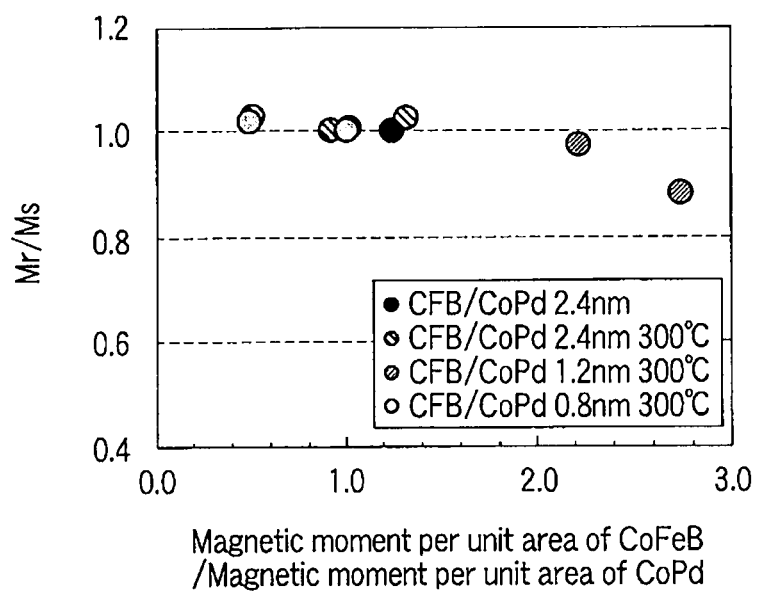
F I G. 6

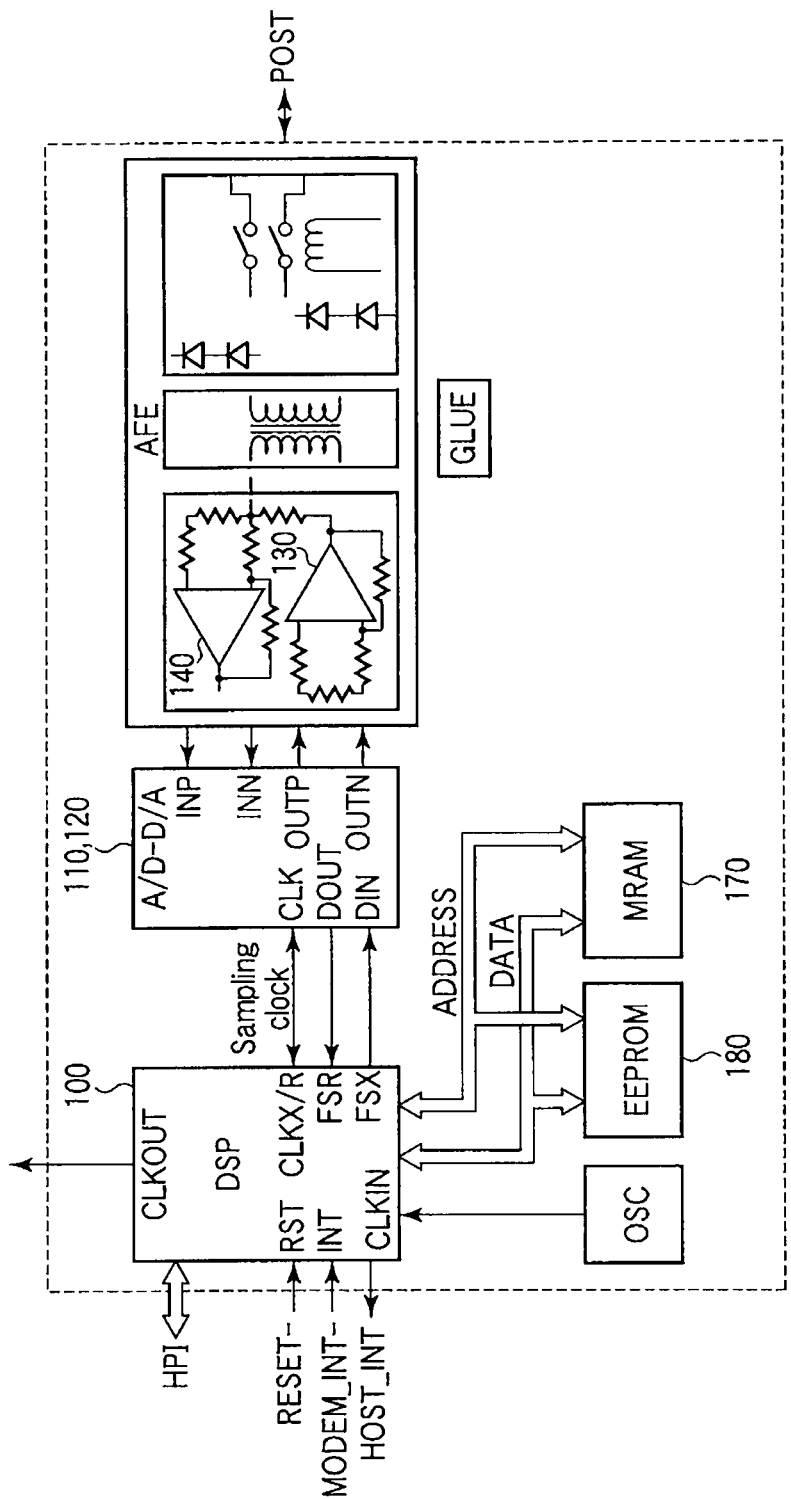
F I G. 11

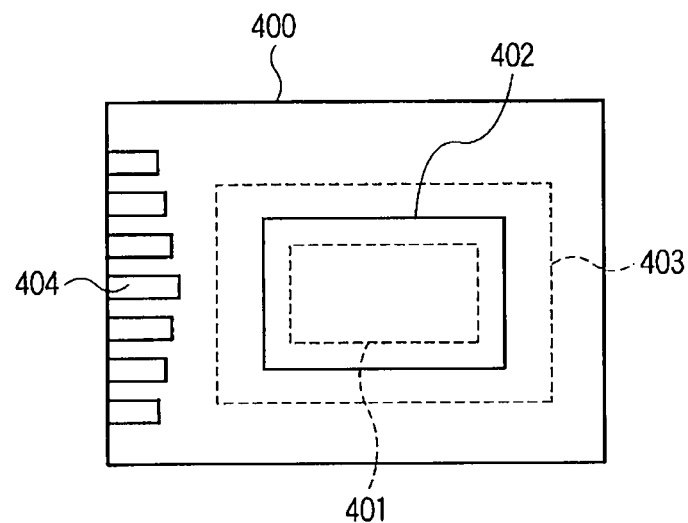
F I G. 13

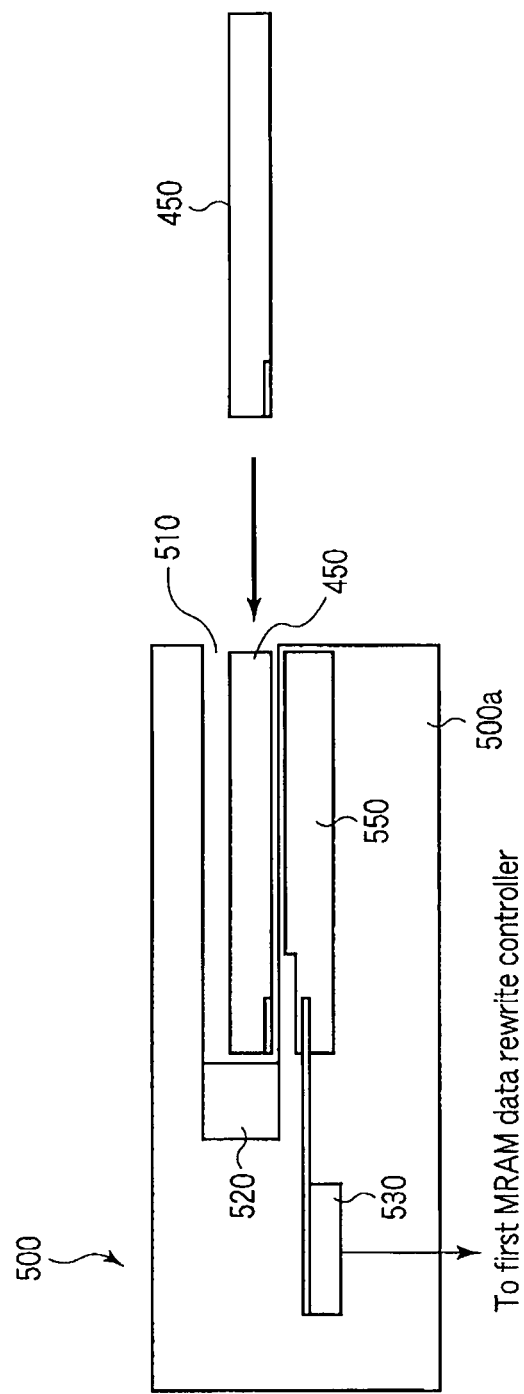
F I G. 15

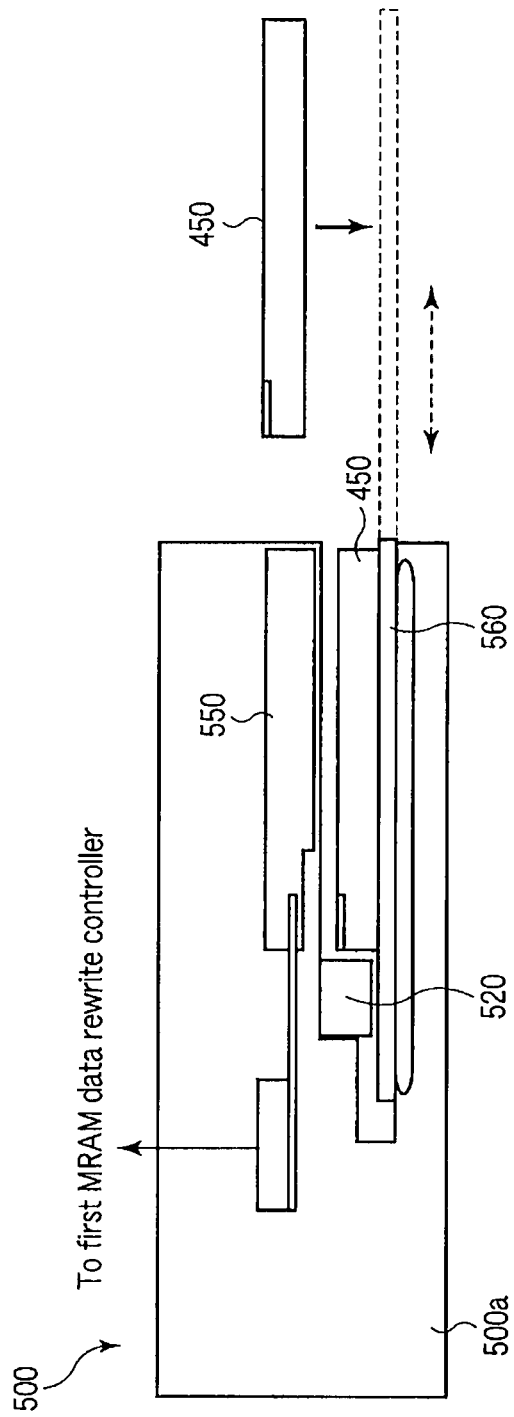
F I G. 17 ced on the position of the storage layer in one direction, i.e., the
MAGNETORESISTIVE ELEMENT AND MAGNETIC MEMORY

CROSS REFERENCE TO RELATED APPLICATIONS

This application is a Continuation Application of PCT Application No. PCT/JP2010/055938, filed Mar. 31, 2010, the entire contents of which are incorporated herein by reference.

FIELD

Embodiments described herein relate generally to a magnetoresistive element and a magnetic memory.

BACKGROUND

In recent years, as a next-generation high-capacity solid nonvolatile memory that can perform high-speed reading/writing and low-power consumption operations, a magnetic random access memory (which will be referred to as an MRAM hereinafter) utilizing a magnetoresistance effect of a ferromagnetic material has attracted a great deal of interest. In particular, a magnetoresistive element having a ferromagnetic tunnel junction has drawn attention since it was discovered that it has a high magnetoresistance change ratio.

The ferromagnetic tunnel junction basically has a three-layer laminated structure including a storage layer having a variable magnetization direction, an insulator layer and a fixed layer that faces the storage layer and maintains a predetermined magnetization direction. When a current is flowed through this ferromagnetic tunnel junction, the current tunnels through the insulator layer to flow. At this time, the resistance in the junction unit changes depending on a relative angle of the magnetization directions of the storage layer and the fixed layer, and it takes a minimal value when the magnetization directions are parallel whilst it takes a maximal value when these directions are anti-parallel.

This change in resistance is called a tunneling magneto-resistance effect (which will be referred to as a TMR effect hereinafter). When actually using a magnetoresistive element having a ferromagnetic tunnel junction as one memory cell, a parallel state and an anti-parallel state of magnetization (i.e., a relative minimum and a relative maximum of resistance) of the storage layer and the fixed layer are associated with binary information "0" and "1", respectively, thereby storing information.

In regard to writing of stored contents in the magnetoresistive element, there is known a magnetic field write system by which a write wiring line is arranged near a memory cell and a magnetization direction of a storage layer alone is reversed by using a current magnetic field produced when flowing a current.

However, when an element size is reduced to realize a high-capacity memory, the coercive force (Hc) of a magnetic material constituting the storage layer increases in principle, and hence there is a tendency that a current required for writing is increased as the element is miniaturized. Further, since the current magnetic field from the writing wiring line decreases in principle with respect to a reduction in cell size, achieving both the reduction in cell size and the decrease in writing current required for high-capacity design is difficult in the magnetic field write system.

On the other hand, in recent years, as a write system that overcomes this problem, a write (spin injection write) system using spin momentum transfer (SMT) is suggested. According to this system, a spin polarized current is flowed through a magnetoresistive element to reverse a magnetization direction of a storage layer, and a quantity of spin polarized electrons to be injected can be reduced as a volume of a magnetic layer forming the storage layer is small. Therefore, this system is expected as a write system that can achieve both miniaturization of the element and realization of a low current.

However, when the element is miniaturized to achieve a high capacity, an energy barrier that maintains the magnetization direction of the storage layer in one direction, i.e., the magnetic anisotropic energy becomes smaller than the thermal energy, whereby a problem that a magnetization direction of a magnetic material sways (thermal disturbance) and stored information can be no longer maintained becomes obvious.

In general, since the energy barrier required for the magnetization direction reversal is represented as a product of a magnetic anisotropic constant (magnetic anisotropic energy per unit volume) and a magnetization reversal unit volume, a material having a high magnetic anisotropic constant must be selected to assure resistance against thermal disturbance in a fine element size region.

In an in-plane magnetization type configuration mainly examined in conventional examples, shape magnetic anisotropy is generally utilized. In this case, to increase the magnetic anisotropic energy, countermeasures such as an increase in aspect ratio of a magnetoresistive element, an increase in film thickness of a storage layer, an increase in saturated magnetization of the storage layer and other measures are required. However, when considering the characteristics of the spin injection system, these countermeasures lead to an increase in inversion current, and hence they are not suitable for miniaturization.

On the other hand, utilizing a material having high crystal magnetic anisotropy rather than the shape magnetic anisotropy can be also considered. In this case, however, an easy-axis in an in-plane direction is greatly decentralized within a film surface, and hence an MR ratio (Magnetoresistance ratio) is lowered or incoherent precessional movement is induced, thereby increasing an inversion current. Therefore, this countermeasure is not preferable either.

Furthermore, in the in-plane magnetization configuration, the magnetic anisotropy that arises based on a shape is utilized, and hence the inversion current is sensitive to unevenness in shape. As a result, when the unevenness in shape increases with miniaturization, unevenness in inversion current also increases.

On the other hand, as a ferromagnetic material constituting a magnetoresistive element, using a so-called perpendicular magnetization film having an easy-axis along a film surface perpendicular direction can be considered. When utilizing the crystal magnetic anisotropy in the perpendicular magnetization type configuration, since the shape anisotropy is not used, an element shape can be reduced to be smaller than that in the in-plane magnetization type configuration. Moreover, since the decentralization of the magnetization easy direction can be also reduced, it can be expected that adopting a material having the high crystal magnetic anisotropy enables achieving both the miniaturization and a low current while maintaining the resistance against the thermal disturbance.

Examples of materials used for the perpendicular magnetization film include $L1_o$ ordered alloy series (FePt, CoPt and others), artificial lattice series (Co/Pt, Pd), hcp series (CoPt and others), and RE-TM series (Tb—CoFe and others).

In general, the inversion current required to enable reverse magnetization by the spin injection system is dependent on saturated magnetization Ms and a magnetic relaxation constant α of a storage layer. Therefore, to reverse the magnetization of the storage layer by the spin injection of a low current, reducing the saturated magnetization Ms and the magnetic relaxation α is important.

The saturated magnetization Ms can be decreased by, e.g., adjusting the composition of the magnetic material, or adding a nonmagnetic element. However, the decrease in saturated magnetization Ms should not have any adverse effect on other characteristics.

Also, the magnetic relaxation constant α can be decreased by a multilayered film including a magnetic layer having a small magnetic relaxation constant and a perpendicular magnetization film (e.g., any of the above-described material systems) having a large magnetic relaxation constant. Since the capacity will further be increased in the future, however, this measure alone is insufficient to decrease the inversion current.

BRIEF DESCRIPTION OF THE DRAWINGS

FIG. 5 is a view showing the relationship between the residual magnetization ratio and the film thickness;

FIG. 6 is a view showing the relationship between the residual magnetization ratio and the magnetic moment ratio per unit area;

FIG. 11 is a block diagram showing a DSL data path unit of a DSL modem;

FIG. 13 is a plan view showing an MRAM card;

FIG. 15 is a sectional view showing the transfer apparatus;

FIG. 17 is a sectional view showing a sliding type transfer apparatus.

DETAILED DESCRIPTION

Figure 1:
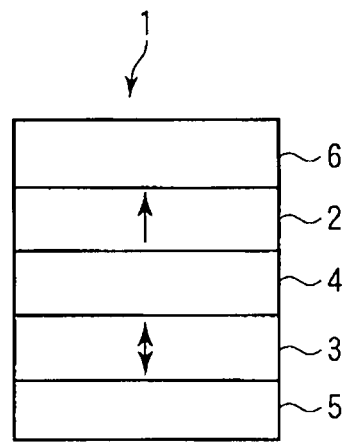
FIG. 1 is a view showing the primary parts of an MR element of the first embodiment.

In general, according to one embodiment, a magnetoresistive element comprises: a first magnetic layer having a magnetization substantially perpendicular to a film plane, a direction of the magnetization being variable; a second magnetic layer having a magnetization substantially perpendicular to a film plane, a direction of the magnetization being invariable; and a first nonmagnetic layer between the first and second magnetic layer, wherein the first magnetic layer has a laminated structure of first and second ferromagnetic materials, a magnetization direction of the first magnetic layer is changed by a current which passes through the first magnetic layer, the first nonmagnetic layer and the second magnetic layer, a perpendicular magnetic anisotropy energy of the second ferromagnetic material is smaller than that of the first ferromagnetic material, and a film thickness of the first ferromagnetic material is thinner than that of the second ferromagnetic material.

The basic concept of a magnetoresistive element according to an embodiment will be explained below.

In the following explanation, the same reference numerals denote constituent elements having almost the same functions and arrangements, and a repetitive explanation will be made only when necessary. However, it should be noted that the drawings are exemplary views, so the relationship between the thickness and the planar dimension, the ratio of the thickness of each layer, and the like are different from actual ones. Accordingly, practical thicknesses and dimensions should be judged by referring to the following explanation. Also, the individual drawings of course include portions having different dimensional relationships and different ratios.

Note also that each embodiment to be explained below exemplarily discloses an apparatus and/or method for embodying the technical idea of the present invention, and the technical idea of the present invention does not specify the materials, shapes, structures, layouts, and the like of parts to those described below. The technical idea of the present invention can variously be changed within the scope of the appended claims.

First Embodiment

The first embodiment relates to a magnetoresistive element.

(1) Configuration of Magnetoresistive Element

FIG. 1 shows a major part of a magnetoresistive element of the first embodiment.

Referring to FIG. 1, each arrow indicates a magnetization direction. A magnetoresistive element mentioned in this specification and the scope of claims means a TMR (Tunneling Magneto-Resistance effect) element using a semiconductor or insulator as a spacer layer. Also, the following drawings show the primary parts of the magnetoresistive element, but other layers may also be included as long as the arrangements shown in the drawings are included.

Magnetoresistive element 1 writes information by the spin transfer torque magnetization reversing method. That is, in accordance with the direction of a spin polarization current supplied to each layer in a direction perpendicular to the film surface, the relative angle of magnetization between a storage layer and fixed layer is made to correspond to binary information "0" or "1" by changing the parallel and anti-parallel states (i.e., the minimum and maximum of the resistance), thereby storing information.

As shown in FIG. 1, magnetoresistive element 1 at least includes two magnetic layers 2 and 3, and nonmagnetic layer 4 formed between magnetic layers 2 and 3. Magnetic layer 3 has the easy-axis in the direction perpendicular to the film surface, and rotates along a plane intersecting the film surface. Magnetic layer 3 will be called a storage layer (a free layer, magnetization free layer, magnetization variable layer, or recording layer) hereinafter. The storage layer (magnetic layer 3) has a structure in which at least first and second ferromagnetic materials are laminated. The properties of the storage layer (magnetic layer 3) will be described in detail later. Magnetization in the direction perpendicular to the film surface will be called perpendicular magnetization hereinafter.

Magnetic layer 2 has the easy-axis in the direction perpendicular to the film surface, and the magnetization direction is fixed with respect to the storage layer. Magnetic layer 2 will be called a fixed layer (a magnetization fixed layer, reference layer, magnetization reference layer, pinned layer, standard layer, or magnetization standard layer) hereinafter. The properties of the fixed layer will be described in detail later. Note that the magnetization direction in the fixed layer (magnetic layer 2) points in the opposite direction (upward) to the substrate as a typical example in FIG. 1, but this magnetization direction may also point in the direction to the substrate (downward).

Nonmagnetic layer (tunnel barrier layer) 4 is made of an insulating film such as an oxide. The properties of nonmagnetic layer 4 will be described in more detail later.

Magnetoresistive element 1 is a magnetoresistive element for use in the spin transfer torque writing method. That is, when writing information, an electric current is supplied from the fixed layer (magnetic layer 2) to the storage layer (magnetic layer 3), or from the storage layer (magnetic layer 3) to the fixed layer (magnetic layer 2), in the direction perpendicular to the film surface, thereby injecting electrons in which spin information is accumulated, into the storage layer (magnetic layer 3) from the fixed layer (magnetic layer 2).

The spin momentum of the injected electrons is transferred to electrons in the storage layer (magnetic layer 3) in accordance with the spin momentum conservation law, thereby reversing the magnetization of the storage layer (magnetic layer 3). That is, the magnetization direction of the storage layer (magnetic layer 3) changes in accordance with a bidirectional electric current flowing through nonmagnetic layer 4 and the fixed layer (magnetic layer 2).

FIG. 1 shows a so-called top-pin structure in which the storage layer (magnetic layer 3) is formed on underlying layer 5, and the fixed layer (magnetic layer 2) is formed on nonmagnetic layer 4.

Underlying layer 5 may also be formed below the storage layer (magnetic layer 3). Underlying layer 5 is used to control the crystallinity such as the crystal orientation and crystal grain size of each layer above the storage layer (magnetic layer 3). Details of the properties will be described later.

Cap layer 6 may also be formed on the fixed layer (magnetic layer 2). Cap layer 6 mainly functions as a protective layer, e.g., prevents the oxidation of the magnetic layer.

The perpendicular magnetic anisotropy of the second ferromagnetic material forming the storage layer (magnetic layer 3) is smaller than that of the first ferromagnetic material. Also, the magnetic moment per unit area of the first ferromagnetic material is smaller than that of the second ferromagnetic material. The film thickness of the first ferromagnetic material is smaller than that of the second ferromagnetic material.

The first ferromagnetic material is, e.g., an alloy containing Co and Pd or Co and Pt, and is preferentially oriented with respect to the atomic dense surface of the alloy.

The second ferromagnetic material is, e.g., an alloy $(Co_{100-x}-Fe_x)_{100-y}B_y$ containing Co, Fe, and B, in which $x \geq 20$ at % and $0 < y \leq 30$ at %. The second ferromagnetic material may also be, e.g., an alloy containing Co and Fe and further containing at least one of Ta, Si, Nb, V, W, Cr, Mo, and B. Furthermore, the second ferromagnetic material may be, e.g., a stack of these elements such as CoFeB/CoFeTa or CoFeB/CoFeBTa.

The second ferromagnetic material may have a cubic or tetragonal crystal structure, and contain (100)-oriented crystal grains.

Figure 2:
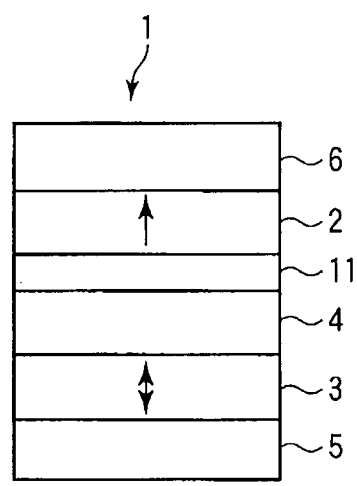
FIGS. 2 and 3 are views showing modifications of FIG. 1.

FIG. 2 shows a modification of the magnetoresistive element shown in FIG. 1.

A structure shown in FIG. 2 differs from the structure shown in FIG. 1 in that interface layer 11 is inserted between the fixed layer (magnetic layer 2) and nonmagnetic layer 4. Interface layer 11 is made of a ferromagnetic material, has the effect of reducing lattice mismatch in the interface between the fixed layer (magnetic layer 2) and nonmagnetic layer 4, and also has the effect of achieving a high TMr and high spin transfer torque efficiency by using a high-polarization-ratio material. Interface layer 11 is made of a ferromagnetic material. The properties of interface layer 11 will be described in detail later.

Figure 3:
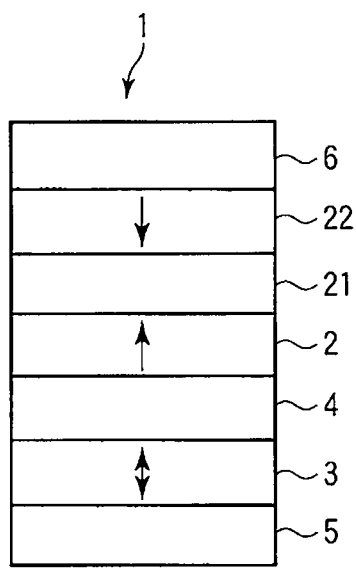

FIG. 3 shows another modification of the magnetoresistive element shown in FIG. 1.

A structure shown in FIG. 3 differs from the structure shown in FIG. 1 in that nonmagnetic layer 21 and bias layer (shift adjusting layer) 22 are inserted between the fixed layer (magnetic layer 2) and cap layer 6.

Bias layer 22 is a perpendicular magnetization film made of a ferromagnetic material and having the easy-axis in the direction perpendicular to the film surface, and is fixed in the opposite direction to the magnetization direction of the fixed layer (magnetic layer 2). Bias layer 22 has the effect of adjusting the offset of the storage layer reversal characteristic in the opposite direction, which is caused by a stray magnetic field from the fixed layer (magnetic layer 2) and poses a problem when processing the element.

Also, like the structure shown in FIG. 2, an interface layer may also be inserted between nonmagnetic layer 4 and the fixed layer (magnetic layer 2) in the structure shown in FIG. 3. The properties of nonmagnetic layer 21 and bias layer 22 will be described in detail later.

(2) Storage Layer

When using a perpendicular magnetization film as the storage layer (magnetic layer 3) of magnetoresistive element 1, the element size can be made smaller than that of an in-plane magnetization type element because no shape anisotropy is used as described previously. By using a material having a large perpendicular magnetic anisotropy, therefore, it is possible to achieve both downsizing and a low electric current while maintaining the thermal disturbance resistance. The necessary properties of the storage layer and practical examples of material selection will be explained in detail below.

(2-1) Necessary Properties of Storage Layer

When using a perpendicular magnetization material as the storage layer, a thermal disturbance index $\Delta$ is represented as follows by using the ratio of effective anisotropic energy $K_u^{eff} \cdot V$ to thermal energy $k_B T$.

$$\Delta = K_u^{eff} \cdot V / k_B T \qquad \text{(expression 1)}$$
$$= (K_u - 2\pi N M_S^2) \cdot Va / k_B T$$

where
$K_u$: perpendicular magnetic anisotropy constant
$M_S$: saturated magnetization
N: demagnetization coefficient
Va: magnetization reversal unit volume
T: absolute temperature To avoid the problem (thermal disturbance) that the thermal energy fluctuates magnetization, $\Delta > \sim 60$ is a necessary condition. If the element size or film thickness is decreased in order to increase the capacity, however, Va decreases, and this may make it unable to store information (=thermal disturbance), and unstable.

Accordingly, it is desirable to select a material having a large perpendicular magnetic anisotropy constant $K_u$ and/or small saturated magnetization $M_S$ as the storage layer.

On the other hand, critical current $I_C$ required for magnetization reversal by the perpendicular magnetization type spin transfer torque writing method is generally represented by $$I_C \propto \alpha/\eta \cdot \Delta \quad \text{(expression 2)}$$

where
- $\alpha$: magnetic relaxation constant
- $\eta$: spin transfer torque efficiency coefficient (2-2) Storage Layer Material As described above, to achieve both a sufficient thermal disturbance resistance and magnetization reversal by a low electric current by using a perpendicular magnetization film, it is desirable to decrease magnetic relaxation constant $\alpha$ and increase spin transfer torque efficiency coefficient $\eta$ while maintaining the thermal disturbance index ($\Delta$).

Since spin transfer torque efficiency coefficient $\eta$ monotonically increases with respect to the polarization ratio, a material having a high polarization ratio is desirable. As described in patent literature 2, magnetic relaxation constant $\alpha$ can be reduced by a multilayered film including a magnetic layer having small magnetic relaxation constant $\alpha$-small and a perpendicular magnetization film having large magnetic relaxation constant $\alpha$-large.

The magnetic layer having small magnetic relaxation constant $\alpha$-small is made of a material having perpendicular magnetic anisotropy smaller than that of the perpendicular magnetization film. In this case, however, the film thickness of the magnetic layer having small magnetic relaxation constant $\alpha$-small is smaller than that of the perpendicular magnetization film, so the reduction in inversion current is insufficient. Therefore, it is necessary to further reduce the electric current in order to achieve a larger capacity in the future.

In this embodiment, the storage layer (magnetic layer 3) is made of the first and second ferromagnetic materials, and the perpendicular magnetization film as the first ferromagnetic material has sufficiently large perpendicular magnetic anisotropy constant Ku even in a very thin region where the film thickness is 2 nm or less. Accordingly, even when the second ferromagnetic material has perpendicular magnetic anisotropy smaller than that of the first ferromagnetic material and a film thickness larger than that of the first ferromagnetic material, the second ferromagnetic material forms a perpendicular magnetization film by the magnetic exchange coupling between the first and second ferromagnetic materials.

This makes it possible to reflect the features of the second ferromagnetic material on the storage layer (magnetic layer 3). For example, the second ferromagnetic material can be a material having small magnetic relaxation constant $\alpha$, high affinity for the material (e.g., an oxide having the NaCl structure) forming nonmagnetic layer 4, a high polarization ratio, and high spin transfer torque efficiency coefficient $\eta$. Practical examples of the second ferromagnetic material will be explained in detail later.

Practical examples will be explained below.

(2-2-1) Examples of First Ferromagnetic Material Forming Storage Layer

The first ferromagnetic material forming the storage layer (magnetic layer 3) of magnetoresistive element 1 according to the first embodiment is made of an alloy containing cobalt (Co) and palladium (Pd). To form a perpendicular magnetization film, the film need only be densely formed in the plane of the film surface, i.e., need only be grown in the fcc(111) direction or hcp(0001) direction.

More specifically, crystal orientation growth can be controlled by properly selecting underlying layer 5 shown in FIGS. 1, 2, and 3. Details of underlying layer 5 and a practical formation method will be described later.

Figure 4:
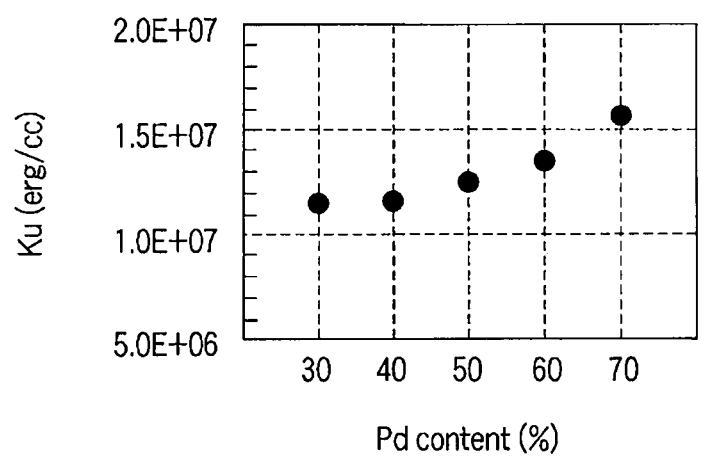
FIG. 4 is a view showing the dependence of the perpendicular magnetic anisotropic energy on the Pd concentration.

FIG. 4 shows the dependence of the effective perpendicular magnetic anisotropic energy of a CoPd film on the Pd concentration.

The abscissa indicates the Pd composition ratio, and the ordinate indicates magnetic anisotropy constant $K_u^{eff}$. FIG. 4 reveals that a high perpendicular magnetic anisotropy of $1 \times 10^7$ (erg/cc) or more can be obtained by changing the Pd composition ratio and saturated magnetization $M_s$.

This high perpendicular magnetic anisotropy makes it possible to provide a magnetoresistive element having a high thermal stability even when downsized.

(2-2-2) Examples of Second Ferromagnetic Material Forming Storage Layer

The second ferromagnetic material forming the storage layer (magnetic layer 3) of magnetoresistive element 1 according to the first embodiment is made of an alloy containing at least one element selected from Co, Fe, and Ni. For example, as described in non-patent literature 2, magnetic relaxation constant $\alpha$ of a three-element alloy, i.e., Co—Fe—Ni is particularly small for Co—Fe and Ni—Fe. Therefore, these alloys are suitable for the second ferromagnetic material.

Also, the second ferromagnetic material desirably has the same function as that of an interface layer (to be described later).

That is, when an oxide having the NaCl structure is used as nonmagnetic layer 4 and crystals of the oxide are grown on (i) an alloy containing one or more of Fe, Co, and Ni, e.g., an amorphous CoFeNiB alloy, or (ii) an alloy having the body-centered cubic (BCC) structure and a (100) preferred orientation plane and containing one or more of Fe, Co, and Ni, the crystals are easily grown on the (100) plane as a preferential orientation plane.

Especially on an amorphous alloy CoFe—X (X is at least one of B, C, and N) to which B, C, or N is added, it is very readily possible to preferentially orient the (100) plane. According to non-patent reference 2, CoFe—B has a small magnetic relaxation constant and hence is suited to the second ferromagnetic material.

(2-2-3) Example According to Multilayered Structure of First and Second Ferromagnetic Materials In this example, the storage layer (magnetic layer 3) of magnetoresistive element 1 contains $Co_{57}Pd_{43}$ as the first ferromagnetic material, and $Co_{40}Fe_{40}B_{20}$ as the second ferromagnetic material. That is, the multilayered structure is $Co_{40}Fe_{40}B_{20}/Co_{57}Pd_{43}$.

FIG. 5 shows the relationship between the residual magnetization ratio and the film thickness.

Referring to FIG. 5, the film thickness is the film thickness of CoFeB (CFB) as the second ferromagnetic material, and the residual magnetization ratio is the ratio (Mr/Ms) of residual magnetization Mr (magnetization when a magnetic field is zero) to saturated magnetization Ms on a magnetization curve measured by applying a magnetic field in the direction perpendicular to the film surface.

Each plot has the film thickness (2.4, 1.2, or 0.8 nm) of a CoPd alloy and the annealing temperature (300° C.) after film formation as parameters. As described previously, the perpendicular magnetic anisotropy of a 2.4-nm thick CoPd alloy is large. However, the (Mr/Ms) of a 0.8-nm thick CoPd alloy is almost 1 even when CoFeB having a film thickness larger than 0.8 nm is laminated on it, so the direction perpendicular to the film surface is the easy-axis.

As shown in FIG. 5, it is possible to implement an arrangement in which the (Mr/Ms) is almost 1, not only in a region where the film thickness of the first ferromagnetic material is larger than that of the second ferromagnetic material, but also in a region where the film thickness of the first ferromagnetic material is smaller than that of the second ferromagnetic material.

That is, FIG. 5 reveals that when the perpendicular magnetic anisotropy of the second ferromagnetic material is smaller than that of the first ferromagnetic material, perpendicular magnetic anisotropy can be secured (the direction perpendicular to the film surface is the easy-axis) in the whole storage layer made of the first and second ferromagnetic materials, even if the film thickness of the first ferromagnetic material is smaller than that of the second ferromagnetic material.

FIG. 6 shows the relationship between the residual magnetization ratio and the magnetic moment ratio per unit area.

The residual magnetization ratio (Mr/Ms) is the same as in FIG. 5. The magnetic moment ratio is the ratio (M2/M1) of magnetic moment M2 per unit area of CoFeB as the second ferromagnetic material to magnetic moment M1 (the product of the saturated magnetization and film thickness) per unit area of a CoPd alloy as the first ferromagnetic material. To increase the residual magnetization ratio (e.g., nearly 0.9 or more), the M2/M1 is preferably 2.8 or less, and more preferably, 2.2 or less.

The magnetic moment ratio indicates which of the first and second ferromagnetic materials largely contributes as the storage layer.

As shown in FIG. 6, it is possible to implement an arrangement in which the magnetic moment ratio is almost 1, not only in a region where magnetic moment M1 per unit area of the first ferromagnetic material is larger than magnetic moment M2 per unit area of the second ferromagnetic material, but also in a region where magnetic moment M1 per unit area of the first ferromagnetic material is smaller than magnetic moment M2 per unit area of the second ferromagnetic material.

That is, FIG. 6 reveals that when the perpendicular magnetic anisotropy of the second ferromagnetic material is smaller than that of the first ferromagnetic material, perpendicular magnetic anisotropy can be ensured (the direction perpendicular to the film surface is the easy-axis) in the whole storage layer made of the first and second ferromagnetic materials, even if magnetic moment M1 per unit area of the first ferromagnetic material is smaller than magnetic moment M2 per unit area of the second ferromagnetic material.

When the Mr/Ms is almost 1, magnetization directions almost point in the direction perpendicular to the film surface with no magnetic field being applied. That is, as the Mr/Ms decreases from 1, the amount of magnetization parts inclining from the direction perpendicular to the film surface increases. Since the magnetoresistive ratio also depends on the relative angle between two magnetizations in the fixed layer and storage layer, the Mr/Ms is preferably 0.9 or more, and more preferably, 0.95 or more. Furthermore, although FIGS. 5 and 6 show measurement points where the Mr/Ms exceeds 1, they are errors occurring during VSM measurement.

Figure 7:
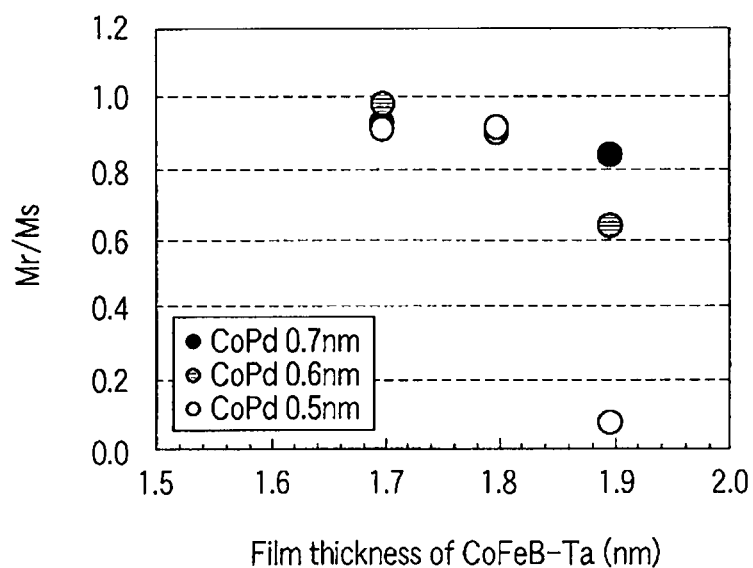
FIG. 7 is a view showing the relationship between the residual magnetization ratio and the film thickness.

FIG. 7 shows the relationship between the residual magnetization ratio and the film thickness.

Referring to FIG. 7, the abscissa is the film thickness of CoFeB (CFB)—Ta as the second ferromagnetic material, and the residual magnetization ratio is the ratio (Mr/Ms) of residual magnetization Mr (magnetization when a magnetic field is zero) to saturated magnetization Ms on a magnetization curve measured by applying a magnetic field in the direction perpendicular to the film surface.

CoFeB—Ta is a material obtained by adding Ta to $CO_{40}Fe_{40}B_{20}$. A material obtained by stacking CoFeB and Ta may also be used instead of CoFeB—Ta. Examples are CoFeB/Ta/CoFeB (e.g., $CO_{40}Fe_{40}B_{20}/Ta/CO_{40}Fe_4O_{20}$) and CoFeB/Ta (e.g., $CO_{40}Fe_4O_{20}/Ta$). The first ferromagnetic layer material is $CO_{57}Pd_{43}$.

Each plot has the film thickness (0.5, 0.6, or 0.7 nm) of a CoPd alloy as a parameter. The (Mr/Ms) is almost 1 even in a region where the film thickness of CoFeB—Ta is larger than that of the CoPd alloy, indicating that a perpendicular magnetization film is formed. The amount of Ta added to CoFeB is 5 to 30 vol %, e.g., about 20 vol %, and the Ms is about 700 emu/cc. The Ms can be adjusted by changing the Ta addition amount. Also, the additive element is not limited to Ta. Examples of an element for adjusting the Ms instead of Ta are Ti, V, Cr, Zr, Nb, Mo, Hf, and W.

Similarly to FIG. 5, FIG. 6 demonstrates that when the perpendicular magnetic anisotropy of the second ferromagnetic material is smaller than that of the first ferromagnetic material, perpendicular magnetic anisotropy can be secured (the direction perpendicular to the film surface is the easy-axis) in the whole storage layer made of the first and second ferromagnetic materials, even if the film thickness of the first ferromagnetic material is smaller than that of the second ferromagnetic material.

Also, for all of the three film thicknesses of the CoPd alloy, the Mr/Ms can be set at 0.9 when the film thickness of CoFeB—Ta is 1.8 nm or less. That is, the film thickness of CoFeB—Ta is desirably 1.8 nm or less.

Furthermore, ratio Rt of the film thickness of CoFeB—Ta to that of the CoPd alloy is desirably less than 3.8. More specifically, the Rt is 3.6 (=1.8 nm/0.5 nm) or less, desirably 3.0 (=1.8 nm/0.6 nm) or less, and more desirably 2.57 (=1.8 nm/0.7 nm) or less.

Even when magnetic moment M1 per unit area of the first ferromagnetic material is smaller than magnetic moment M2 of the second ferromagnetic material, film thickness t2 of the second ferromagnetic material is sometimes smaller than film thickness t1 of the first ferromagnetic material. In this case, the saturated magnetization of the second ferromagnetic material is larger than that of the first ferromagnetic material. For example, as disclosed in J. Appl. Phys. 105 (2009) 07B726, when using a Co—Ni—Pt alloy instead of $Co_{50}Pt_{50}$, the saturated magnetization can be decreased from 940 emu/cc of CoPt to about 500 to 600 emu/cc of Co—Ni—Pt. The saturated magnetization of CoFeB is about 1,000 to 1,400 emu/cc, although it also depends on the composition.

(3) Underlying Layer

As indicated in the detailed explanation of the storage layer described above, to form a perpendicular magnetization film having the easy-axis in the direction perpendicular to the film surface, it is necessary to form a structure in which the atomic dense surface is readily oriented. That is, the crystal orientation must be controlled to orient the fcc(111) plane and hcp (001) plane, and the selection of an underlying layer material and multilayered arrangement is important for this purpose.

(3-1) Laminated Structure of Underlying layer

Figure 8:
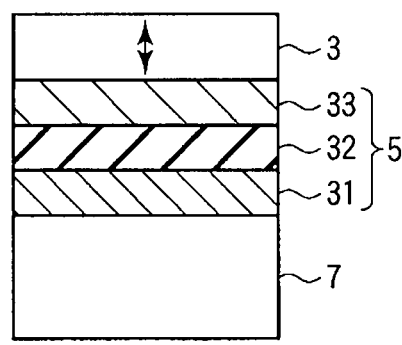
FIG. 8 is a sectional view showing a multilayered structure including an underlying layer and storage layer of the first embodiment.

FIG. 8 is a sectional view showing a multilayered structure including the underlying layer and storage layer (magnetic layer).

In this multilayered structure, underlying layer 5 is formed on Si substrate 7 with a thermal oxide film. Also, CoPd having a film thickness of about 2 nm is formed as the storage layer (magnetic layer 3) on underlying layer 5. The arrangement above CoPd is as shown in FIGS. 1, 2, and 3.

In underlying layer 5 of the magnetoresistive element according to the first embodiment, underlying layer 33 is preferably a metal material that lattice-matches with CoPd and a CoPt alloy. Underlying layer 31 preferably has a material and arrangement that improve the adhesion to Si substrate 7, and also improve the smoothness and crystal orientation of underlying layers 32 and 33. Underlying layers 32 and 33 are preferably made of an Ru layer having a film thickness of about 3 nm, or a Pt layer having a film thickness of about 3 nm.

Practical materials of underlying layers 31 to 33 will be described below.

(3-2) Materials of Underlying layers

A metal having a dense structure is used as underlying layer 33.

Examples of a metal that lattice-matches with a CoPd alloy and CoPt alloy and has a dense structure are Pt, Pd, Ir, and Ru. It is also possible to use an alloy containing two metal elements, or three or more metal elements, instead of one metal element. Examples are Pt—Pd and Pt—Ir. Furthermore, it is possible to use, e.g., Pt—Cu, Pd—Cu, Ir—Cu, Pt—Au, Ru—Au, Pt—Al, or Ir—Al as an alloy of the above-described metal and an fcc metal such as Cu, Au, or Al, or to use, e.g., Pt—Re, Pt—Ti, Ru—Re, Ru—Ti, Ru—Zr, or Ru—Hf as an alloy of the above-described metal and an hcp metal such as Re, Ti, Zr, or Hf. Since the smoothness worsens if the film thickness is too large, the film thickness range is favorably 30 nm or less. Underlying layers 32 and 33 are laminated in order to adjust the lattice constant before the formation of a CoPd alloy and CoPt alloy, by stacking materials having different lattice constants. For example, when forming Ru as underlying layer 32 and Pt as underlying layer 33, the lattice constant of Pt in underlying layer 33 becomes different from that of a bulk under the influence of Ru in underlying layer 32. As described previously, however, the lattice constant can also be adjusted by using an alloy, so one of underlying layers 32 and 33 may be omitted.

Underlying layer 31 in underlying layer 5 is used to improve the smoothness, and the crystal orientation of the dense-structure metal of underlying layers 32 and 33. A practical example is Ta. If the film thickness of underlying layer 31 is too large, the deposition time prolongs, and this decreases the productivity. If the film thickness of underlying layer 31 is too small, the above-described orientation controlling effect is lost. Therefore, the film thickness of underlying layer 31 is preferably 1 to 10 nm.

(4) Nonmagnetic Layer

An oxide having the NaCl structure is favorable as the material of nonmagnetic layer 4 of the magnetoresistive element according to the first embodiment. Practical examples are MgO, CaO, SrO, TiO, VO, and NbO. When the magnetization directions in storage layer 3 and fixed layer 2 are anti-parallel, a spin-polarized Δ1 band dominates tunnel conduction, so only majority spin electrons contribute to the conduction. Consequently, magnetoresistive element 1 decreases the conductivity and increases the resistance value.

By contrast, when the magnetization directions in storage layer 3 and fixed layer 3 are parallel, a Δ5 band that is not spin-polarized dominates the conduction, so magnetoresistive element 1 increases the conductivity and decreases the resistance value. Accordingly, the formation of the Δ1 band is important to achieve a high TMR.

To form the Δ1 band, the (100) plane of nonmagnetic layer 4 made of the oxide having the NaCl structure matches well with the interface between storage layer 3 and fixed layer 2.

Interface layer 11 may also be inserted in order to further improve the lattice matching in the (100) plane of nonmagnetic layer 4 made of the oxide having the NaCl structure. To form the Δ1 band, it is more preferable to select, as interface layer 11, a material by which lattice mismatch in the (100) plane of nonmagnetic layer 4 is 5% or less.

(5) Fixed Layer

As the fixed layer (magnetic layer 2) of magnetoresistive element 1 shown in FIGS. 1, 2, and 3, it is favorable to select a material that does not easily change the magnetization direction with respect to the storage layer (magnetic layer 3). That is, it is favorable to select a material having large effective magnetic anisotropy $K_u^{eff}$, large saturated magnetization $M_s$, and large magnetic relaxation constant $\alpha$. Practical materials will be described below.

(5-1) Ordered Alloy

An ordered alloy is an alloy containing one or more elements selected from Fe, Co, and Ni, and one or more elements selected from Pt and Pd, and having an $L1_0$ crystal structure. Examples are $Fe_{50}Pt_{50}$, $Fe_{50}Pd_{50}$, $Co_{50}Pt_{50}$, $Fe_{30}Ni_{20}Pt_{50}$, $Co_{30}Fe_{20}Pt_{50}$, and $Co_{30}Ni_{20}Pt_{50}$. These ordered alloys are not limited to the above-mentioned composition ratios.

The effective magnetic anisotropic energy and saturated magnetization can be adjusted by adding, to these ordered alloys, impurity elements such as Cu (copper), Cr (chromium), and Ag (silver) or alloys of these elements, and insulators. When using any of these alloys as the fixed layer (magnetic layer 2), particularly, when selecting a material having a large lattice mismatch with nonmagnetic layer 4, interface layer 11 is preferably inserted between nonmagnetic layer 4 and the fixed layer (magnetic layer 2) as shown in FIG. 2.

(5-2) Artificial Lattice

An artificial lattice is a structure obtained by alternately stacking an alloy containing one or more elements selected from Fe, Co, and Ni and an alloy containing one or more elements selected from Cr, Pt, Pd, Ir, Rh, Ru, Os, Re, Au, and Cu. Examples are a Co/Pt artificial lattice, a Co/Pd artificial lattice, a CoCr/Pt artificial lattice, a Co/Ru artificial lattice, Co/Os, Co/Au, and an Ni/Cu artificial lattice.

The effective magnetic anisotropic energy and saturated magnetization of these artificial lattices can be adjusted by adding elements to the magnetic layer, and adjusting the film thickness ratio of the magnetic layer to the nonmagnetic layer and the stacking period. The use of these multilayered films as the fixed layer (magnetic layer 2) is undesirable to achieve a high TMR, because the lattice mismatch with nonmagnetic layer 4 is large in many cases.

In this case, as shown in FIG. 2, interface layer 11 is preferably inserted between nonmagnetic layer 4 and the fixed layer (magnetic layer 2).

(5-3) Disordered Alloy

An example of a disordered alloy is a metal mainly containing cobalt (Co), and containing one or more elements selected from chromium (Cr), tantalum (Ta), niobium (Nb), vanadium (V), tungsten (W), hafnium (Hf), titanium (Ti), zirconium (Zr), platinum (Pt), palladium (Pd), iron (Fe), and nickel (Ni).

Examples are a CoCr alloy, CoPt alloy, CoCrPt alloy, CoCrPtTa alloy, and CoCrNb alloy.

The effective magnetic anisotropic energy and saturated magnetization of these alloys can be adjusted by increasing the ratio of the nonmagnetic element. The use of these alloys as the fixed layer (magnetic layer 2) is unfavorable to achieve a high TMR, because the lattice mismatch with nonmagnetic layer 4 is large in many cases.

In this case, as shown in FIG. 2, interface layer 11 is preferably inserted between nonmagnetic layer 4 and the fixed layer (magnetic layer 2).

(6) Interface Layer

To increase the magnetoresistive ratio (TMR ratio), interface layer 11 shown in FIG. 2 may be formed in the interface of the magnetic layer (the fixed layer (magnetic layer 2)) in contact with nonmagnetic layer 4 of magnetoresistive element 1 according to the first embodiment.

Interface layer 11 is preferably made of a high-polarization-ratio material, practically, an alloy $(Co_{100-x}-Fe_x)_{100-y}B_y$ containing Co, Fe, and B, in which $100 \geq x \geq 20$ at % and $0 < y \leq 30$ at %.

When using these magnetic materials as interface layer 11, lattice mismatch between the fixed layer (magnetic layer 2) and nonmagnetic layer 4 is reduced. In addition, the effect of achieving a high TMR and high spin transfer torque efficiency can be expected because the materials are high-polarization-ratio materials.

(7) Bias Layer

As shown in FIG. 3, nonmagnetic layer 21 and bias layer (shift adjusting layer) 22 may be formed between fixed layer 2 and cap layer 6 of magnetoresistive element 1 according to the first embodiment. This makes it possible to perform adjustment such that the shift of the inversion current in storage layer 3 caused by a stray magnetic field from fixed layer 2 approaches 0.

Nonmagnetic layer 21 desirably has a heat resistance that prevents fixed layer 2 and bias layer 22 from being mixed in a heating step, and a function of controlling the crystal orientation when forming bias layer 22.

In addition, if the film thickness of nonmagnetic layer 21 increases, the distance between bias layer 22 and storage layer 3 increases, and this decreases a shift adjusting magnetic field applied from bias layer 22 to the storage layer (magnetic layer 3). Accordingly, the film thickness of nonmagnetic layer 21 is desirably 5 nm or less.

Bias layer 22 is made of a ferromagnetic material having the easy-axis in the direction perpendicular to the film surface. More specifically, the examples of the material of the fixed layer (magnetic layer 2) can be used. However, bias layer 22 is farther from the storage layer (magnetic layer 3) than the fixed layer (magnetic layer 2). To adjust a stray magnetic field applied to the storage layer (magnetic layer 3) by using bias layer 22, therefore, it is necessary to make the film thickness or saturated magnetization Ms of bias layer 22 larger than that of the fixed layer (magnetic layer 2).

That is, letting $t_2$ and $M_{S2}$ be the film thickness and saturated magnetization of the fixed layer (magnetic layer 2), and $t_{22}$ and $M_{S22}$ be the film thickness and saturated magnetization of bias layer 22, the following relation must be satisfied.

$$M_{S2} \times t_2 < M_{S22} \times t_{22} \qquad \text{(expression 3)}$$

For example, if a magnetic material having saturated magnetization Ms of 1,000 emu/cc and a film thickness of 5 nm is used as the fixed layer (magnetic layer 2) when processing an element size of 50 nm, nonmagnetic layer 21 must have a film thickness of 3 nm, and bias layer 22 must have bias layer characteristics by which saturated magnetization Ms is 1,000 emu/cc, and the film thickness is about 15 nm, in order to cancel the shift of the inversion current.

Also, to obtain the above-described shift canceling effect, the magnetization directions in the fixed layer (magnetic layer 2) and bias layer 22 must be set anti-parallel.

To meet this relationship, it is only necessary to select a material satisfying Hc2>Hc22 or Hc2<Hc22 between coercive force Hc2 of the fixed layer (magnetic layer 2) and coercive force Hc22 of bias layer 22. In this case, the magnetization directions in the fixed layer (magnetic layer 2) and bias layer 22 can be set anti-parallel by reversing the magnetization direction in the layer having a smaller coercive force by minor loop magnetization beforehand.

The magnetization directions in the fixed layer (magnetic layer 2) and bias layer 22 can also be set anti-parallel by coupling the fixed layer (magnetic layer 2) and bias layer 22 via nonmagnetic layer 21 by SAF (Synthetic Anti-Ferromagnetic) coupling.

More specifically, the magnetization directions in the fixed layer (magnetic layer 2) and bias layer 22 can be set anti-parallel by coupling these layers by using, e.g., ruthenium (Ru) as the material of nonmagnetic layer 21. This makes it possible to reduce the stray magnetic field from the fixed layer (magnetic layer 2) by using bias layer 22, thereby reducing the shift of the inversion current in the storage layer (magnetic layer 3).

As a consequence, the variations in inversion current in the storage layer (magnetic layer 3) can be reduced between elements.

As described above, the magnetoresistive element according to the first embodiment makes it possible to obtain a magnetoresistive element for the spin transfer torque writing method that is thermally stable and capable of magnetization reversal with a low electric current.

Second Embodiment

The second embodiment relates to a magnetic random access memory (MRAM) using the magnetoresistive element of the first embodiment, and discloses a configuration example of the memory.

Figure 9:
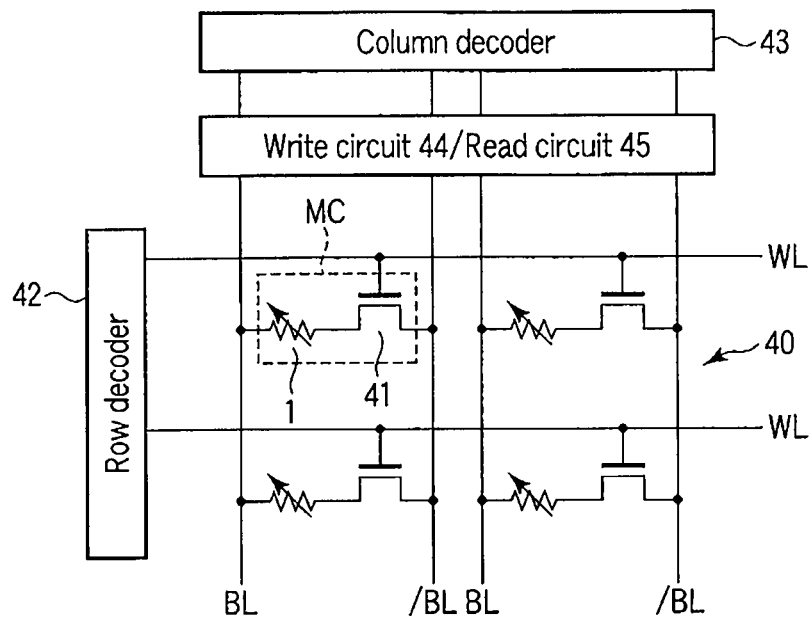
FIG. 9 is a circuit diagram showing an MRAM of the second embodiment.

FIG. 9 is a circuit diagram showing the arrangement of the MRAM of the second embodiment.

This MRAM includes memory cell array 40 including memory cells MC arranged in a matrix. In memory cell array 40, bit line pairs BL and /BL run in the column direction. Also, word lines WL run in the row direction in memory cell array 40.

Memory cells MC are arranged at the intersections of bit lines BL and word lines WL. Each memory cell MC includes magnetoresistive element 1, and selection transistor 41 that is an N-channel MOS transistor. One terminal of magnetoresistive element 1 is connected to bit line BL. The other terminal of magnetoresistive element 1 is connected to the drain terminal of selection transistor 41. The gate terminal of selection transistor 41 is connected to word line WL. The source terminal of selection transistor 41 is connected to bit line /BL.

Row decoder 42 is connected to word lines WL. Write circuit 44 and read circuit 45 are connected to bit line pairs BL and /BL. Column decoder 43 is connected to write circuit 44 and read circuit 45. Row decoder 42 and column decoder 43 select each memory cell MC.

Data is written in memory cell MC as follows. First, to select memory cell MC as a data write target, word line WL connected to memory cell MC is activated. This turns on selection transistor 41.

In this state, bidirectional write current Iw is supplied to magnetoresistive element 1 in accordance with write data. More specifically, when supplying write current Iw to magnetoresistive element 1 from the left to the right, write circuit 44 applies a positive voltage to bit line BL, and the ground voltage to bit line /BL. When supplying write current Iw to magnetoresistive element 1 from the right to the left, write circuit 44 applies a positive voltage to bit line /BL, and the ground voltage to bit line BL. Thus, data "0" or "1" can be written in memory cell MC.

Next, data read from memory cell MC is performed as follows. First, selection transistor 41 of memory cell MC to be selected is turned on. Read circuit 45 supplies read current Ir flowing from the right to the left, for example, to magnetoresistive element 1. Based on read current Ir, read circuit 45 detects the resistance value of magnetoresistive element 10. Thus, data stored in magnetoresistive element 1 can be read out.

The structure of the MRAM will now be explained.

Figure 10:
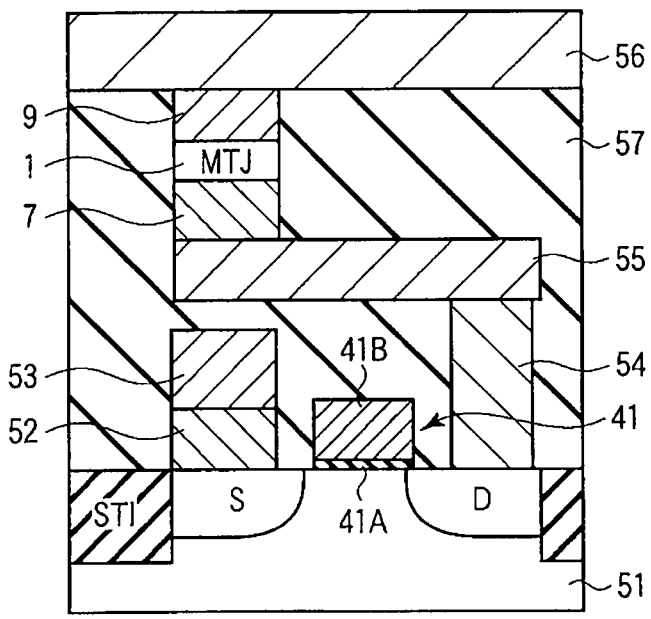
FIG. 10 is a sectional view showing one memory cell MC.

FIG. 10 is a sectional view showing one memory cell MC.

An element isolation insulating layer is formed in the surface region of p-type semiconductor substrate 51. The surface region of semiconductor substrate 51 in which no element isolation insulating layer is formed is an active area where an element is to be formed. The element isolation insulating layer is formed by, e.g., STI (Shallow Trench Isolation). Silicon oxide or the like is used as the STI.

In the active area of semiconductor substrate 51, source region S and drain region D spaced apart from each other are formed. Each of source region S and drain region D is an $n^+$-type diffusion region formed by heavily doping an $n^+$-type impurity into semiconductor substrate 51. On semiconductor substrate 51 between source region S and drain region D, gate electrode 41B is formed on gate insulating film 41A. Gate electrode 41B functions as word line WL. Selection transistor 41 is thus formed on semiconductor substrate 51.

On source region S, interconnection layer 53 is formed on contact 52. Interconnection layer 53 functions as bit line /BL. On drain region D, extraction line 55 is formed on contact 54. On extraction line 55, magnetoresistive element 1 sandwiched between lower electrode 7 and upper electrode 9 is formed. Interconnection layer 56 is formed on upper electrode 9. Interconnection layer 56 functions as bit line BL. Also, the portion between semiconductor substrate 51 and interconnection layer 56 is filled with an interlayer dielectric layer 57 made of, e.g., silicon oxide.

In the second embodiment as described in detail above, an MRAM can be fabricated by using magnetoresistive element 1. Note that magnetoresistive element 1 can also be used as a domain wall displacement type magnetic memory, in addition to a spin transfer torque type magnetic memory.

The MRAM disclosed in the second embodiment is applicable to various apparatuses. Several application examples of the MRAM will be explained below.

Application Example 1

FIG. 11 specifically shows a digital subscriber line (DSL) data path unit of a DSL modem.

This modem includes programmable digital signal processor (DSP) 100, analog-to-digital (A/D) converter 110, digital-to-analog (D/A) converter 120, transmission driver 130, and receiver amplifier 140.

FIG. 11 shows no bandpass filter. Instead, FIG. 11 shows MRAM 170 of this embodiment and EEPROM 180, as various types of optional memories for holding a line code program (a program to be executed by the DSP to select and operate a modem in accordance with, e.g., subscriber line information to be coded, and transmission conditions (line codes; QAM, CAP, RSK, FM, AM, PAM, and DWMT)).

Note that this application example uses the two types of memories, i.e., MRAM 170 and EEPROM 180 as the memories for holding the line code program, but EEPROM 180 may also be replaced with an MRAM. That is, MRAMs alone may also be used instead of the two types of memories.

Application Example 2

Figure 12:
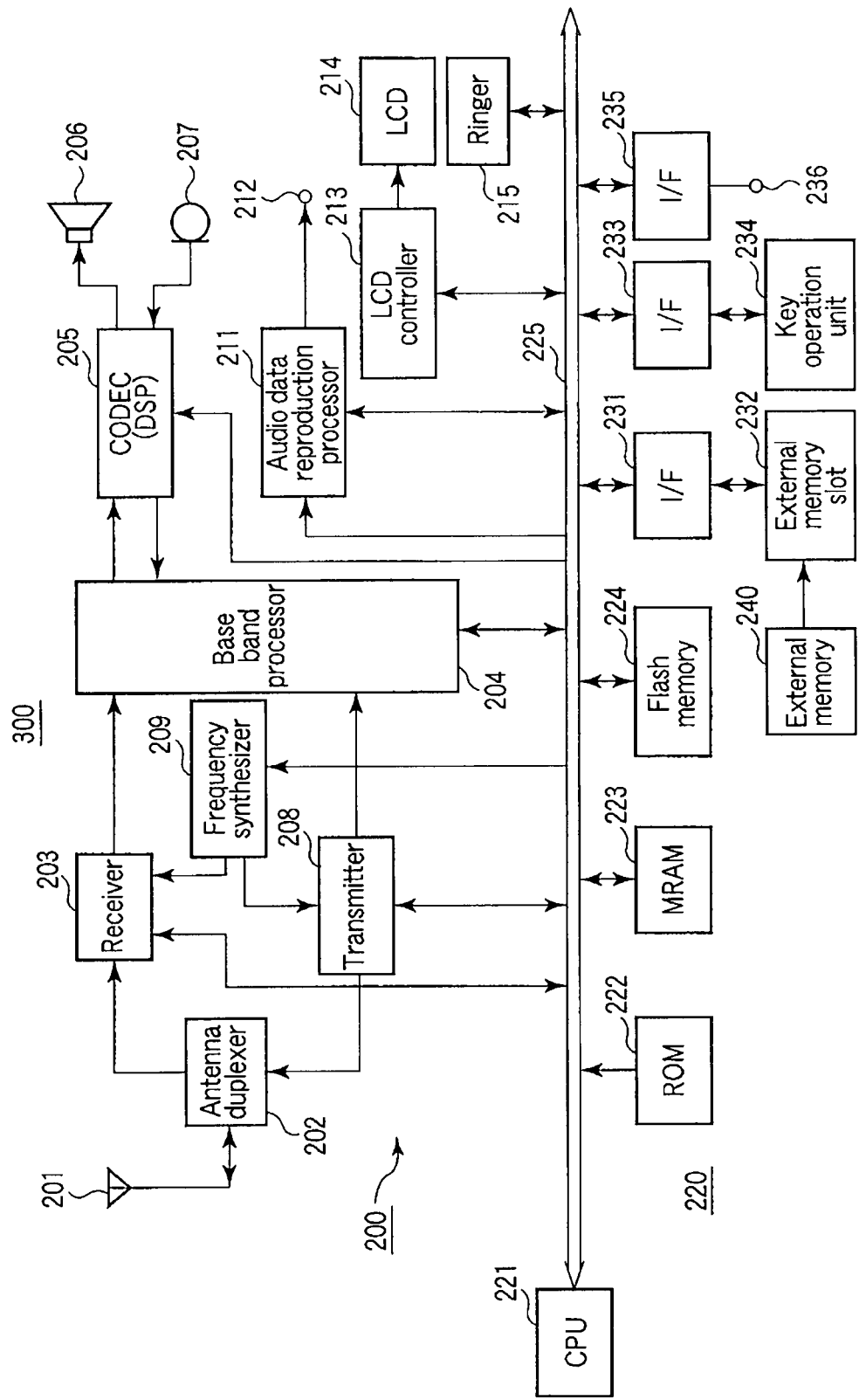
FIG. 12 is a block diagram showing a cell phone terminal.

FIG. 12 shows cell phone terminal 300 as another application example.

Communication unit 200 for implementing a communication function includes transmitting/receiving antenna 201, antenna duplexer 202, receiver 203, base band processor 204, DSP 205 to be used as an audio codec, loudspeaker (receiving apparatus) 206, microphone (transmitting apparatus) 207, transmitter 208, and frequency synthesizer 209.

Cell phone terminal 300 also includes controller 220 for controlling each unit of cell phone terminal 300. Controller 220 is a microcomputer formed by connecting CPU 221, ROM 222, MRAM 223 of this embodiment, and flash memory 224 via bus 225. Programs to be executed by CPU 221 and necessary data such as display fonts are prestored in ROM 222.

MRAM 223 is mainly used as a work area when, e.g., CPU 221 stores data currently being calculated and the like as needed while executing programs, or temporarily stores data to be exchanged between controller 220 and each unit. Flash memory 224 is used to store immediately preceding setting conditions and the like when the power supply of cell phone terminal 300 is turned off, and store setting parameters when the same setting conditions are to be used when the power supply is turned on next time.

Accordingly, the stored setting parameters do not disappear even when the power supply of cell phone terminal 300 is turned off.

In addition, cell phone terminal 300 includes audio reproduction processor 211, external output terminal 212, LCD controller 213, LCD (Liquid Crystal Display) 214 for display, and ringer 215 for generating a ringing tone. Audio reproduction processor 211 reproduces audio information input to cell phone terminal 300 (or audio information stored in external memory 240 (to be described later)). The reproduced audio information can be extracted outside by transmitting the information to headphones or portable loudspeakers via external output terminal 212.

Audio information can be reproduced by using audio reproduction processor 211 as described above. LCD controller 213 receives display information from, e.g., CPU 221 via bus 225, converts the received information into LCD control information for controlling LCD 214, and displays the information by driving LCD 214.

Furthermore, cell phone terminal 300 includes interface circuits (I/Fs) 231, 233, and 235, external memory 240, external memory slot 232, key operation unit 234, and external input/output terminal 236. External memory 240 such as a memory card is inserted into external memory slot 232. External memory slot 232 is connected to bus 225 via interface circuit (I/F) 231.

By thus forming slot 232 in cell phone terminal 300, internal information of cell phone terminal 300 can be written in external memory 240, or information (e.g., audio information) stored in external memory 240 can be input to cell phone terminal 300.

Key operation unit 234 is connected to bus 225 via interface circuit (I/F) 233. Key input information input from key operation unit 234 is transmitted to, e.g., CPU 221. External input/output terminal 236 is connected to bus 225 via interface circuit (I/F) 233, and functions as a terminal for inputting various kinds of external information to cell phone terminal 300, or outputting information outside from cell phone terminal 300.

Note that this application example uses ROM 222, MRAM 223, and flash memory 224, but it is also possible to replace flash memory 224 with an MRAM, and further replace ROM 222 with an MRAM.

Application Example 3

FIGS. 13, 14, 15, 16, and 17 illustrate examples in each of which an MRAM is applied to a card (MRAM card) such as Smart Media for storing media contents.

As shown in FIG. 13, MRAM chip 401 is incorporated into MRAM card main body 400. Card main body 400 has opening 402 formed in a position corresponding to MRAM chip 401, thereby exposing MRAM chip 401. Opening 402 has shutter 403 that protects MRAM chip 401 when this MRAM card is carried. Shutter 403 is made of a material, e.g., ceramic, having the effect of blocking an external magnetic field.

When transferring data, MRAM chip 401 is exposed by opening shutter 403. External terminal 404 is used to extract contents data stored in the MRAM card outside.

Figure 14:
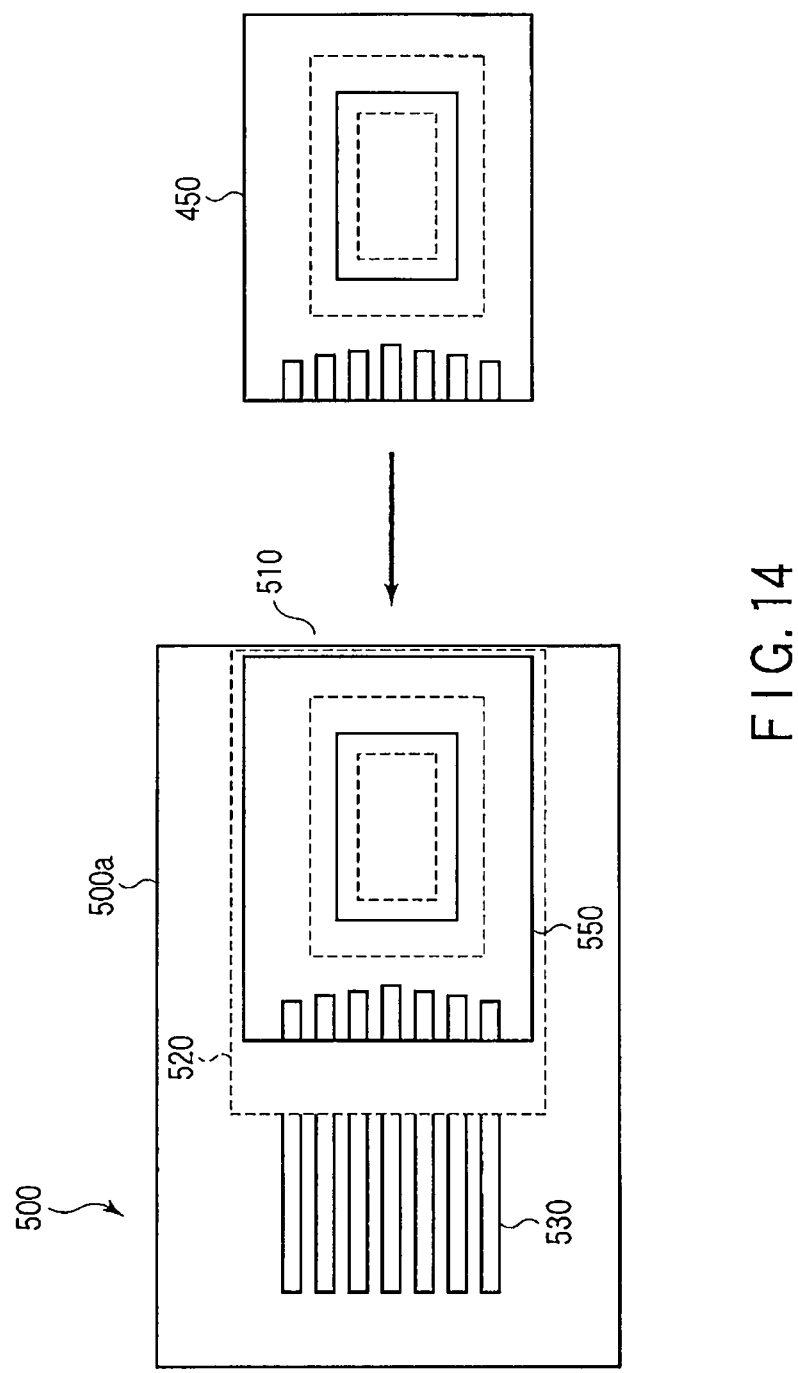
FIG. 14 is a plan view showing a transfer apparatus.

FIGS. 14 and 15 show a card insertion type transfer apparatus for transferring data to the MRAM card.

Data transfer apparatus 500 includes container 500a. Container 500a contains first MRAM card 550. Container 500a includes external terminal 530 electrically connected to first MRAM card 550. Data in first MRAM card 550 is rewritten by using external terminal 530.

Second MRAM card 450 used by an end user is inserted from insertion portion 510 of transfer apparatus 500 as indicated by the arrow, and pushed until it is stopped by stopper 520. Stopper 520 also functions as a member for aligning first MRAM 550 and second MRAM card 450. When second MRAM card 450 is set in a predetermined position, a first MRAM data write controller supplies a control signal to external terminal 530, and data stored in first MRAM 550 is transferred to second MRAM card 450.

Figure 16:
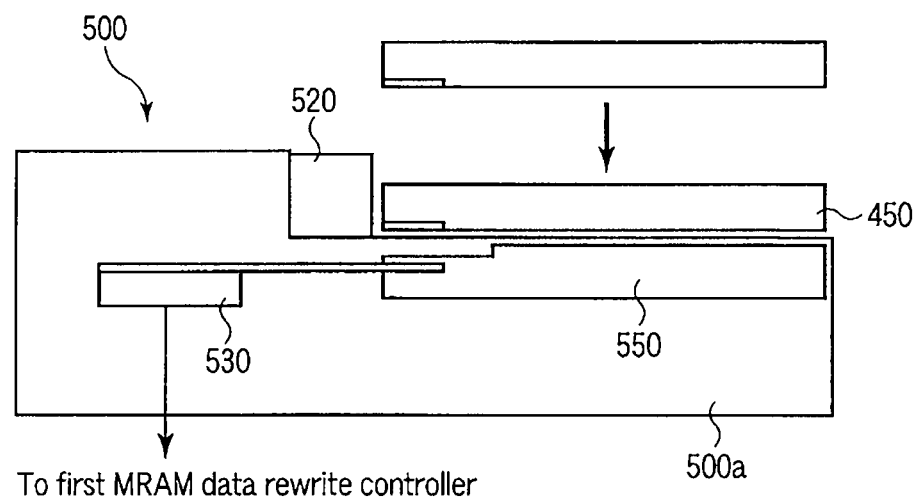
FIG. 16 is a sectional view showing a fitting type transfer apparatus.

FIG. 16 is a sectional view showing a fitting type transfer apparatus.

In transfer apparatus 500, second MRAM card 450 is fitted on first MRAM 550 as indicated by the arrow by using stopper 520 as a target. A transfer method is the same as that of the card insertion type apparatus, so a repetitive explanation will be omitted.

FIG. 17 is a sectional view showing a sliding type transfer apparatus.

Like a CD-ROM drive or DVD drive, receiving slide 560 is formed in transfer apparatus 500, and moved as indicated by the arrows. When receiving slide 560 is moved to a position indicated by the broken lines, second MRAM card 450 is placed on receiving slide 560, and conveyed into transfer apparatus 500.

A transfer method and a feature that second MRAM card 450 is conveyed such that the distal end portion abuts against stopper 520 are the same as those of the card insertion type apparatus, so a repetitive explanation will be omitted.

CONCLUSIONS

According to the embodiment as described in detail above, it is possible to fabricate a magnetoresistive element having a high heat resistance with which the magnetic characteristics and output characteristics do not deteriorate even after a high-temperature annealing process at 300° C. or more, and provide a magnetic memory having a heat resistance higher than those of the conventional memories by using this magnetoresistive element.

That is, the embodiment can provide a magnetoresistive element for the spin transfer torque writing method that is thermally stable and capable of magnetization reversal with a low electric current, and provide a magnetic memory using this magnetoresistive element.

The embodiment has great industrial merits for, e.g., a file memory capable of high-speed random write, a portable terminal capable of high-speed download, a portable player capable of high-speed download, a semiconductor memory for a broadcasting apparatus, a drive recorder, a home video system, a large-capacity buffer memory for communication, and a semiconductor memory for a surveillance camera.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element comprising:
    a first magnetic layer having a magnetization substantially perpendicular to a film plane, a direction of the magnetization being variable;
    a second magnetic layer having a magnetization substantially perpendicular to a film plane, a direction of the magnetization being invariable; and
    a first nonmagnetic layer between the first and second magnetic layer,
    wherein the first magnetic layer has a laminated structure of first and second ferromagnetic materials which are different from each other, the first ferromagnetic material is disposed between the first nonmagnetic layer and the second ferromagnetic material, a magnetization direction of the first magnetic layer is changed by a current which passes through the first magnetic layer, the first nonmagnetic layer and the second magnetic layer, a perpendicular magnetic anisotropy energy of the second ferromagnetic material is smaller than that of the first ferromagnetic material, and a film thickness of the first ferromagnetic material is thinner than that of the second ferromagnetic material.

2. The element of claim 1, further comprising:
    a third magnetic layer with a perpendicular magnetization, which controls a stray magnetic field from the second magnetic layer; and
    a second nonmagnetic layer between the second and third magnetic layers.

3. The element of claim 2,
    wherein the second and third magnetic layers meet a condition of $MS_2 \times t_2 < MS_3 \times t_3$, where $MS_2$ is a saturated magnetization of the second magnetic layer, $t_2$ is a film thickness of the second magnetic layer, $MS_3$ is a saturated magnetization of the third magnetic layer, $t_3$ is a film thickness of the third magnetic layer, and
    magnetization directions of the second and third magnetic layers have a relationship of an anti-parallel.

4. The element of claim 1,
    wherein the first ferromagnetic material comprises the alloy including Co and Pd, or Co and Pt, and
    the first ferromagnetic material has a preferred orientation of close-packed plane of the alloys.

5. The element of claim 1,
    wherein the second ferromagnetic material comprises an alloy including Co, Fe and B, and
    the alloy is $(Co_{100-x}Fe_x)_{100-y}B_y$, where $100 \geq x \geq 20$ at % and $0 < y \leq 30$ at %.

6. The element of claim 1,
wherein the second ferromagnetic material includes Co and Fe, and
the second ferromagnetic material comprises an alloy including one of Ta, Si, Nb, V, W, Cr, Mo and B.

7. The element of claim 1,
wherein the second ferromagnetic material has one of a cubic crystal structure and a tetragonal crystal structure, and includes crystal grains having a (100) preferred orientation.

8. The element of claim 1, further comprising
an interface layer between the second magnetic layer and the first nonmagnetic layer,
wherein the interface layer comprises an alloy including Co, Fe and B, and
the alloy is $(Co_{100-x}Fe_x)_{100-y}B_y$, where $100 \geq x \geq 20$ at % and $0 < y \leq 30$ at %.

9. The element of claim 8,
wherein the interface layer has one of a cubic crystal structure and a tetragonal crystal structure, and includes crystal grains having a (100) preferred orientation.

10. The element of claim 1,
wherein the first nonmagnetic layer includes magnesium oxide.

11. The element of claim 1,
wherein the first ferromagnetic material is CoPd, the second ferromagnetic material is CoFeB including Ta, and a ratio t2/t1 between a film thickness t1 of the first ferromagnetic material and a film thickness t2 of the second ferromagnetic material is less than 3.8.

12. A magnetic memory comprising:
the magnetoresistive element of claim 1; and
a memory cell including first and second electrodes which sandwich the magnetoresistive element.

13. The memory of claim 12, further comprising:
a first conductive line electrically connected to the first electrode;
a second conductive line electrically connected to the second electrode; and
a write circuit electrically connected to the first and second conductive lines, the write circuit supplying the current to the magnetoresistive element.

14. The memory of claim 13,
wherein the memory cell includes a select transistor between the second electrode and the second conductive line.

15. The memory of claim 1,
wherein the second ferromagnetic material is provided between the first nonmagnetic layer and the first ferromagnetic material.

16. A magnetoresistive element comprising:
a first magnetic layer having a magnetization substantially perpendicular to a film plane, a direction of the magnetization being variable;
a second magnetic layer having a magnetization substantially perpendicular to a film plane, a direction of the magnetization being invariable; and
a first nonmagnetic layer between the first and second magnetic layer,
wherein the first magnetic layer has a laminated structure of first and second ferromagnetic materials which are different from each other, the first ferromagnetic material is disposed between the first nonmagnetic layer and the second ferromagnetic material, a magnetization direction of the first magnetic layer is changed by a current which passes through the first magnetic layer, the first nonmagnetic layer and the second magnetic layer, a perpendicular magnetic anisotropy energy of the second ferromagnetic material is smaller than that of the first ferromagnetic material, and a magnetic moment per unit area of the first ferromagnetic material is smaller than that of the second ferromagnetic material.

17. The memory of claim 16,
wherein the second ferromagnetic material is provided between the first nonmagnetic layer and the first ferromagnetic material.

18. The element of claim 16,
wherein the first ferromagnetic material comprises one of a first alloy including Co and Pd, and a second alloy including Co and Pt, and
the first ferromagnetic material is oriented to an atomic dense surface of one of the first and second alloys.

19. The element of claim 16,
wherein the second ferromagnetic material comprises an alloy including Co, Fe and B, and
the alloy is $(Co_{100-x}Fe_x)_{100-y}B_y$, where $100 \geq x \geq 20$ at % and $0 < y \leq 30$ at %.

20. The element of claim 16,
wherein the second ferromagnetic material includes Co and Fe, and
the second ferromagnetic material comprises an alloy including one of Ta, Si, Nb, V, W, Cr, Mo and B.

* * * * *